United States Patent
Smith et al.

(10) Patent No.: US 6,353,906 B1
(45) Date of Patent: *Mar. 5, 2002

(54) TESTING SYNCHRONIZATION CIRCUITRY USING DIGITAL SIMULATION

(75) Inventors: Michael B. Smith, Etobicoke; Michael J. Tresidder, Scarborough, both of (CA)

(73) Assignee: LSI Logic Corporation, Milpitas, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/053,833

(22) Filed: Apr. 1, 1998
(Under 37 CFR 1.47)

(51) Int. Cl.⁷ .................................. G01R 29/00
(52) U.S. Cl. ................... 714/741; 714/731; 714/744
(58) Field of Search ................ 714/731, 741, 714/744, 47, 724, 734; 703/19, 28, 23; 706/915; 375/324, 350, 340; 329/358; 434/218, 352, 323; 376/216; 716/4, 6; 326/16, 94; 327/185

(56) References Cited

U.S. PATENT DOCUMENTS

| | | | |
|---|---|---|---|
| 4,787,062 A | 11/1988 | Nei et al. ................... 364/900 |
| 5,014,226 A | * 5/1991 | Horstmann et al. ..... 395/500.05 |
| 5,259,006 A | 11/1993 | Price et al. ................. 375/107 |
| 5,418,931 A | * 5/1995 | Moorby ....................... 395/500 |
| 5,475,830 A | 12/1995 | Chen et al. .................. 395/500 |
| 5,790,836 A | * 8/1998 | Mizuno ....................... 395/500 |
| 5,923,193 A | * 7/1999 | Bloch et al. ................. 327/141 |
| 6,088,821 A | * 7/2000 | Moriguchi et al. .......... 714/724 |

* cited by examiner

Primary Examiner—Albert Decady
Assistant Examiner—Guy J Lamarre
(74) Attorney, Agent, or Firm—Luedeka, Neely & Graham

(57) ABSTRACT

To vigorously test synchronization logic and protocols in a digital circuit design, a synchronization logic model uses randomization to emulate the uncertainty in synchronization clock delay time exhibited in actual circuits. The synchronization logic model is inserted into a software description of the design so that simulation will reveal faulty assumptions in the synchronization protocol. Additionally, where a non-synchronized signal crosses from one clock domain to another clock domain in an asynchronous digital design, a transition on the non-synchronized signal triggers an "X" value window on the signal for a selected period relative to the receiving clock period, so that simulation will fail if the receiving logic samples the signal value during the "X" value window. These techniques aid in effective testing of the design.

15 Claims, 4 Drawing Sheets

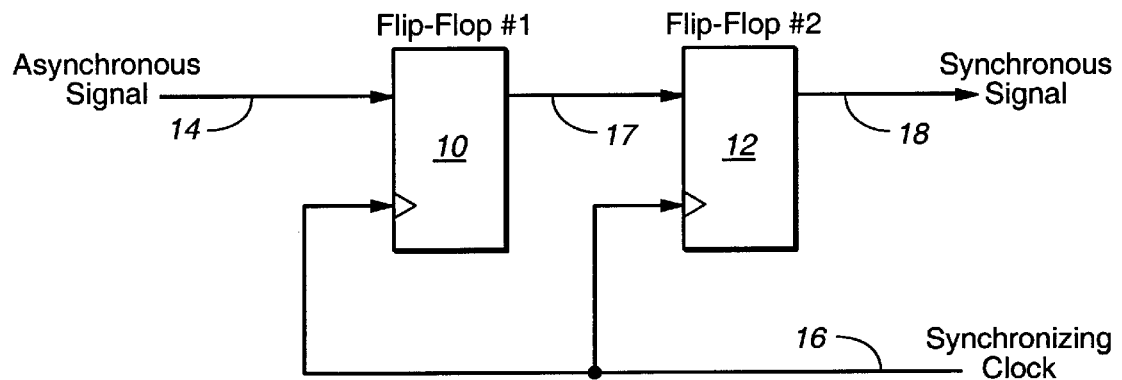
FIG._1
*(PRIOR ART)*
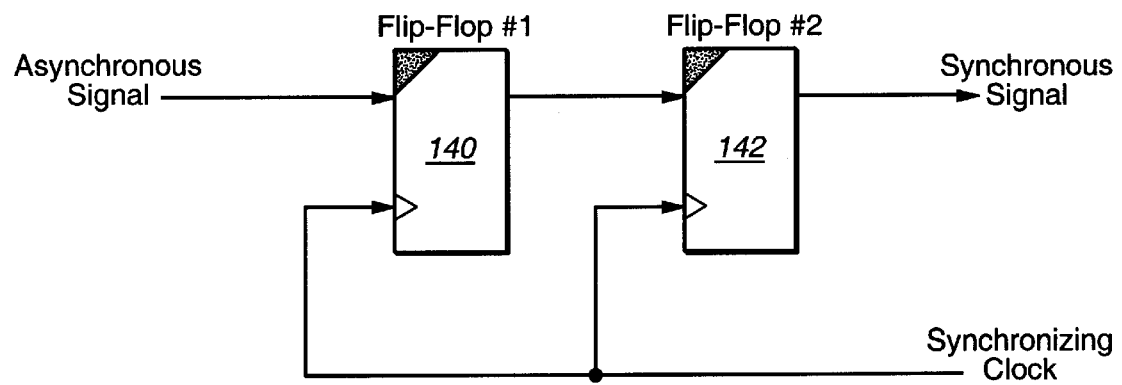
FIG._6

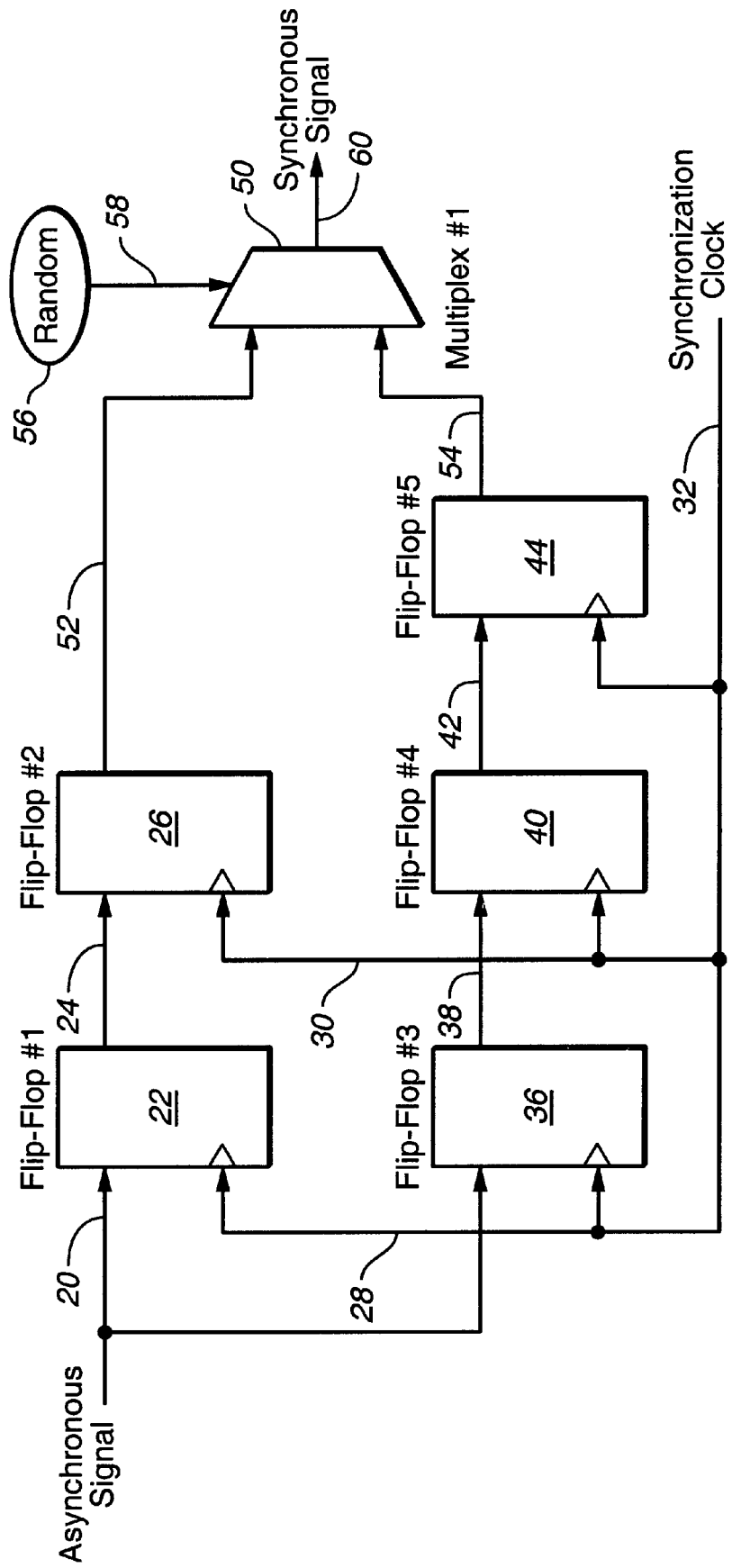
FIG._2

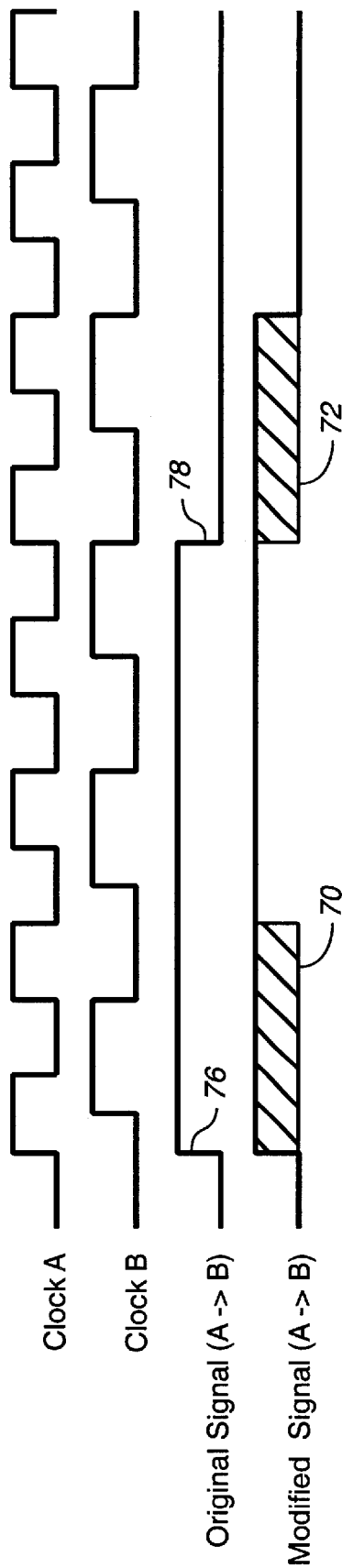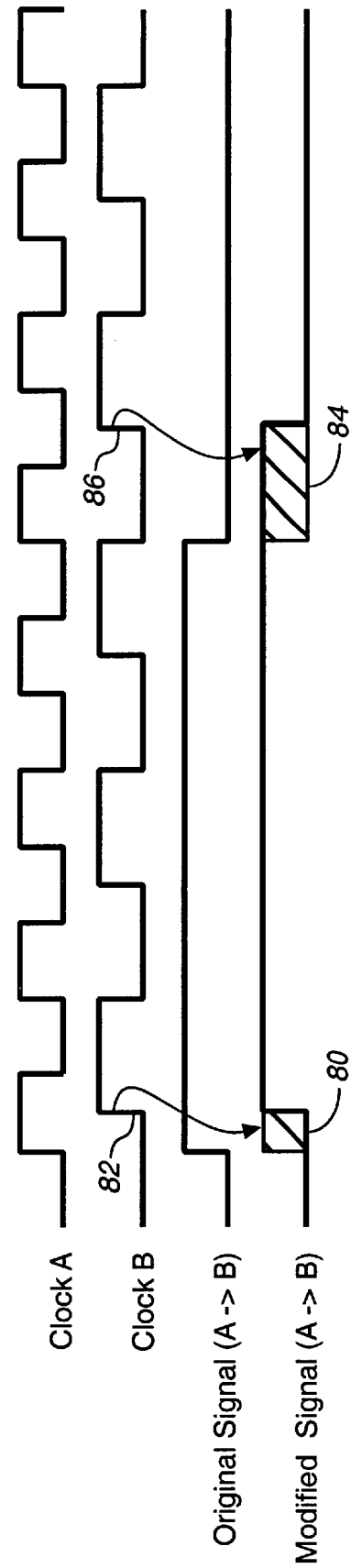

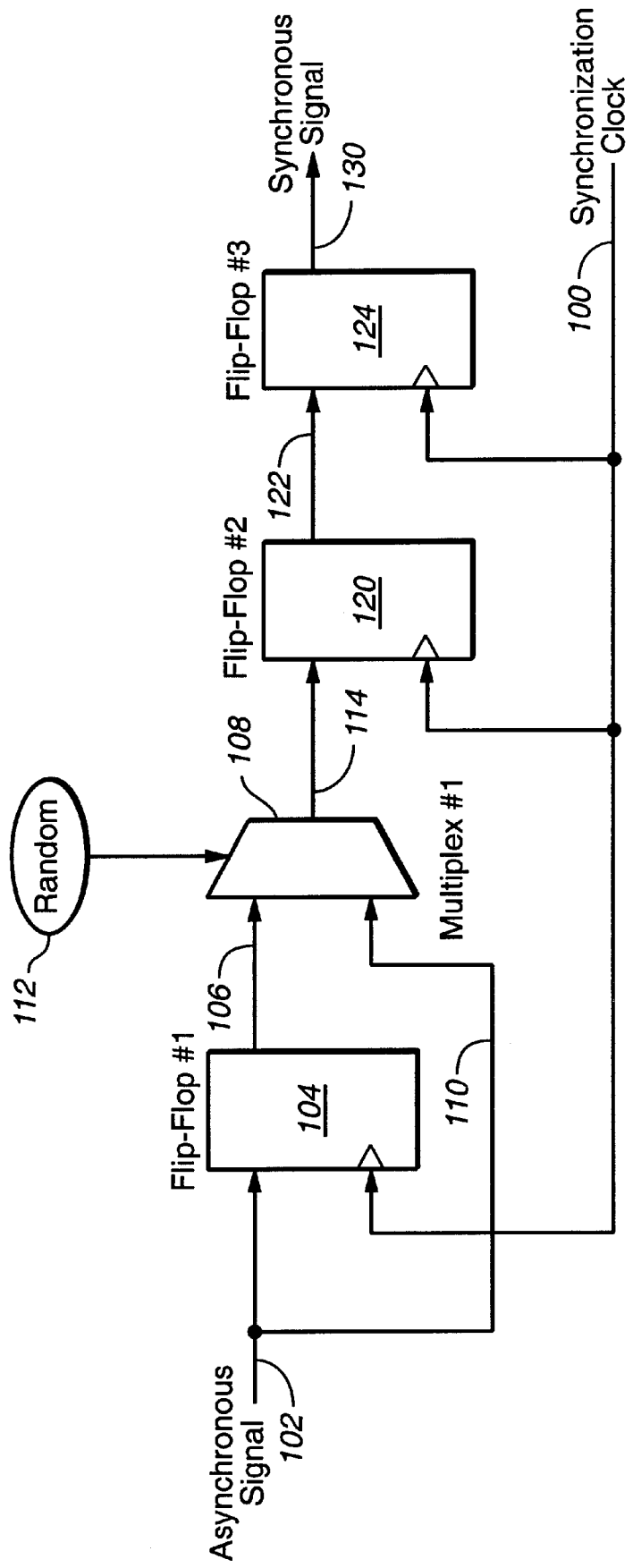
FIG._5

TESTING SYNCHRONIZATION CIRCUITRY USING DIGITAL SIMULATION

FIELD OF THE INVENTION

This invention generally pertains to design and development of digital integrated circuits and, more specifically, relates to methodologies for testing synchronization protocols using a digital simulator so as to ensure proper synchronization of signals crossing clock domain boundaries in an integrated circuit ultimately fabricated in accordance with a given design.

BACKGROUND

Digital integrated circuits continue to grow in density and complexity, as well as operating (clock) speed. With many thousands of gates on a single chip, early verification that a design will indeed provide its intended function has become an essential part of the design process. It is simply too costly —in delay and expense —to wait for "first silicon" to debug a complex digital design. Manual methods such as building and debugging a prototype circuit are not practical. Accordingly, electronic circuit designs are commonly subjected to computer software simulation prior to actual circuit manufacture. Prior to simulation, the proposed design is described using a hardware description language ("HDL"). Various HDL's are known, with Verilog and VHDL being perhaps the two leading examples.

A simulation process or simply "simulator" is a computer program that "exercises" or simulates operation of the design reflected in the HDL description. One well known simulator is Verilog-XL (Cadence Design Systems, Inc., San Jose, Calif.) The simulator exercises the design in response to a defined set of inputs or "test vectors". Because of the sheer size and complexity of many designs, however, 100% testing of all possible logic states and dynamic events is simply not feasible. The test vectors are carefully designed (often using another software tool) in the hope of thoroughly exercising the hardware design to expose any errors or "bugs".

In operation, the simulator sequentially assigns values to variables and applies simulated signals to elements in the hardware design. More specifically, the simulator steps through a sequence of instructions according to a virtual clock —the simulation time clock. The simulation time clock is a surrogate for an actual hardware clock (or clock input) that will drive the actual circuit. Thus, simulated processes defined as occurring at a first clock or simulation time are executed, giving rise to a first set of simulation results, e.g. signal value changes. Then the simulation time is incremented, and once again the various software processes necessary for modeling operation of the hardware design under simulation are executed, using the results of the previous simulation time. As the simulator steps through simulation time in this manner, variable values (modeling physical circuit signals) change and propagate through the circuit.

Many digital designs actually incorporate more than one clock signal. For example, a RISC core on an ASIC may require a first, relatively fast clock, while a memory block on the same chip uses a slower clock. Or, separate clocks of nominally the same frequency can be used to minimize noise. We refer to these different sections of logic as different "clock domains". It is generally necessary to synchronize the data or other signals to the receiving clock whenever signals or data is transferred between two different clock domains. This is conventionally done by providing two back-to-back flip-flop circuits in the receiving clock domain.

Normal zero delay simulation of such a system will work in a predictable manner since the metastability issues that can arise in a real flip-flop are not modeled. Furthermore, timing delays in the dual flip-flop synchronization element that could result in an extra clock being taken to synchronize the signal are also not modeled in a conventional digital simulator. This could lead to unforeseen bugs in the design of the synchronization logic.

FIG. 1 is a simplified schematic of a known synchronization element comprising a first flip flop 10 and a second flip flop 12. On a real device, such as an ASIC, a transition on the asynchronous signal input 14 could violate setup and hold time requirements on flip flop 10; which could result in the flip flop 10 clocking the previous value on its D input (14), rather then the new value, in response to the synchronizing clock signal 16. The new value at 14 would be clocked on the next subsequent clock 16 edge (assuming that the input 14 value had not changed in the interim), which would result in the circuit taking three clock (16) edges for the input to propagate to the output 18, rather than the normally expected value of only two clock edges. Consequently, an actual system that employs the synchronization scheme described may malfunction, even though the simulator does not detect an error.

The need remains, therefore, for improvements in HDL modeling and simulation techniques to overcome these digital simulator deficiencies. What is needed, more specifically, is a way to more vigorously test synchronization logic designs.

Another problem in the design and simulation of a digital circuit is that where a non-synchronized signal crosses from one clock domain to another clock domain, transitions in the signal can create timing violations on the receiving side. The synchronization protocol must ensure that these non-synchronized signals are sampled only when they are stable; yet bugs arising in this regard may be overlooked by the usual testing practices. The need remains therefore for improved methods of testing an asynchronous digital circuit design to reveal faults in the synchronization protocols.

SUMMARY OF THE INVENTION

In view of the foregoing background summary, it is an object of the present invention to overcome deficiencies in known simulation strategies in order to ensure that synchronization circuits will function as intended.

Another object of the invention is to provide an improved methodology for vigorously testing the design of synchronization logic in a digital design.

A further object of the invention is to ensure that during simulation of a digital design, signals that cross clock domain boundaries are sampled only when they are stable, i.e. when they satisfy timing constraints on the receiving side of the boundary.

According to one aspect of the invention, a circuit model—more specifically a behavioral synchronization model—is provided for emulating the variations to be expected in operation of an actual (physical) synchronization element. The circuit model is inserted into a digital design so that simulation of the modified design will expose the effects of variation in the number of clock cycles required by the corresponding synchronization element. The synchronization logic model uses randomization to emulate the uncertainty in synchronization clock delay time exhibited in actual circuits. Preferably, the behavioral synchronization model is provided for each synchronization element in the design.

According to another aspect of the invention, a boundary behavioral module is provided for more rigorous testing of a design where an unsynchronized signal propagates from one clock domain to another. The boundary behavioral module is inserted into the signal path between the two clock domains so as to ensure that the signal is sampled only when it is stable, i.e. when the timing constraints of the receiving element are satisfied. Preferably, the behavioral synchronization module is provided at every net in the design where a signal traverses from one clock domain to another. Of course, the module is not physically inserted into an actual circuit; rather, it is incorporated into the design —more specifically into an HDL description of the design, for purposes of more accurately and thoroughly simulating operation of a circuit according to the design.

The behavioral module modifies the traversing signal so that it has at least one clock period (the receiving clock domain period) during which it has an "X" value. If this modified signal is sampled by the simulator while it has the "X" value, the "X" will quickly propagate through other logic and the simulation will fail. This mechanism guarantees that sampling of a signal from another clock domain is restricted by the design to a "safe" window, and that sampling of the signal outside this window will cause simulation to fail; thus exposing the design bug.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 1 is a schematic diagram of a known dual flip flop synchronization element commonly used for synchronizing a signal crossing a clock domain.

FIG. 2 is a schematic diagram of a circuit for modeling and simulating behavior of a synchronization element in a digital design according to the present invention.

FIG. 3 is a timing diagram illustrating operation of a boundary behavioral module according to another aspect of the invention.

FIG. 4 is a timing diagram illustrating operation of an alternative boundary behavioral module according to further aspect of the invention.

FIG. 5 is a schematic diagram of an improved synchronization circuit in which each flip flop is modified at the gate level to implement the methodology of the present invention.

FIG. 6 is a schematic diagram of an alternative circuit for modeling and simulating behavior of a synchronization element in a digital design.

DETAILED DESCRIPTION OF PREFERRED EMBODIMENTS

As mentioned above, the synchronization logic of FIG. 1 may take two or sometimes three synchronizing clock cycles to ensure synchronization. We have discovered that improved testing of a circuit design can be achieved by modeling this uncertain behavior of the synchronization logic in a manner that will expose weakness in the synchronization scheme during simulation. This approach is very convenient and low cost as compared to, e.g. attempting to modify the simulator itself to better explore clock domain boundary synchronization issues.

In FIG. 2, an asynchronous input signal at node 20 is connected to two separate paths, as follows. In a first path, a first flip flop 22 receives the input signal 20, at a D input, and the Q output 24 is connected to the input of a second flip flop circuit 26. A first flip flop 22 has a clock input 28 and a second flip flop 26 has a clock input 30, both of which are connected to the synchronization clock signal 32. This much is similar to the configuration of the prior art synchronization circuit of FIG. 1. In the second path, the asynchronous input signal 20 is input to a third flip flop 36. The output of flip flop 36 is connected at node 38 to a fourth flip flop circuit 40. The output of flip flop 40 is connected at node 42 to a fifth flip flop circuit 44 so that flip flops 36, 40 and 44 form a serial chain. The clock inputs of flip flops 36, 40 and 44 are all connected to the synchronization clock signal 32. A multiplexer circuit 50 is arranged to receive the output of the first path, i.e., flip flop 26 output at node 52 as a first input to the multiplexer. The output of the second path, i.e., the output of flip flop 44 at node 54 is connected to a second input to multiplexer 50. A random logic state source 56 is connected to the control input 58 for controlling the multiplexer to select input 52 from the first path or input 54 from the second path as the synchronous output signal 60. The random logic state generator 56, which can be implemented using a random number generator, will randomly select which of the two paths is used on every transition of input 24. Thus, on every transition of input 24, the multiplexer 50 will randomly select between the two clock delay path (flip flops 22 and 26) or the three clock delay path (using flip flops 36, 40 and 44). In most designs, there will be multiple synchronization elements, and each synchronization element must be initialized with a different random number seed, to further randomize the behavior of the synchronization logic. This can be conveniently accomplished, by example, by using a counter to assign random number seeds when initializing a simulation of a design. Applying this new methodology to an existing circuit design is straight forward, by simply substituting an HDL description of the circuit of FIG. 2 wherever a synchronization circuit such as that of FIG. 1, appears in the original design. The circuit of FIG. 2 thus mimics the unpredictable behavior of an actual synchronization element to provide more vigorous testing of the design assumptions incorporated into the synchronization logic protocols.

X Transition Creation

As mentioned in the Background, when a non-synchronized signal crosses from one clock domain to another, transitions in the signal can create timing violations with respect to the element in the receiving clock domain. The present invention provides a behavioral module that ensures that such signals are sampled only when they are stable. FIG. 3 illustrates the behavioral module. Referring to FIG. 3, clock A represents a clock signal in a first clock domain and clock B is the clock signal in a second clock domain. An original signal is created in clock domain A and is destined for logic in clock domain B. The problem is, when this signal is sampled in clock domain B, i.e., when the receiving element is evaluated to determine its output logic state, this original signal may or may not have been stable long enough to satisfy the timing constraints of that receiving element. According to the invention, the original signal is modified so that it exhibits an X value, i.e., undetermined, for a period of time at least equal to one clock period relative to the period of clock B. This X value is indicated by the hatched areas of 70 and 72 in FIG. 3. The X value is assigned to the modified signal A beginning at each transition of the original signal. So, for example, the X state 70 begins at the transition 76 on the original signal (rising edge) and the second X state 72 begins at the falling edge 78 of the original signal. Put another way, a rising edge is modified so as to form two transitions: from 0 to X, and then later from X to 1. Conversely, a falling edge is modified to form two transitions; from 1 to X, an then later, from X to 0.

During simulation, if this modified signal is sampled by the simulator while it has an X value, the X will quickly propagate through other logic and the simulation will fail. This mechanism guarantees that sampling of a signal from another clock domain is restricted to a safe window, and that sampling of the signal outside this window will cause the simulation to fail.

This failure mechanism will permit rapid identification of faults, which is critical in the debugging of an ASIC design. This is particularly important with asynchronous designs, since these types of circuits are particularly difficult to design and verify using usual test practices.

The duration of the X signal value after the transition does not have to be a single clock period, necessarily. This X window can have any duration greater than or equal to the receiving clock domain period. As the X window grows larger, it implies that the window in which the receiving logic cannot examine the asynchronous signal gets larger. For example, a value greater than one clock edge could be used if the signal path was a multi-cycle path.

Another alternative implementation would drive the modified signal to an X state until the next rising or falling edge of the receiving clock; in designs with multi-cycle paths, the modified signal would remain X until "n" edges of the receiving clock. This technique is illustrated in the timing diagram of FIG. 4. Referring now to FIG. 4, the two clock domain signals, clock A and clock B are shown as before. The original signal, created in clock domain A is destined for logic in clock domain B. A modified signal as shown in the timing diagram includes an X window 80 that begins on the rising edge of the original signal and concludes in response to a first rising edge 82 of the clock B signal. In other words, the X window ends at the first rising edge of clock B. Similarly, a second X window 84 begins at the falling edge of the original signal and ends at the next rising edge 86 of clock B. As noted, the same principle can be extended by extending the X window until a second or third next transition of the receiving domain clock signal.

Alternative Implementations

A random synchronization element, i.e., a circuit for modeling the behavior of a synchronization circuit was described above with reference to FIG. 2. There are various ways to model the two different delay paths described above with reference to FIG. 2. One such alternative construction is illustrated in the circuit diagram of FIG. 5. In FIG. 5, a synchronization clock signal 100 is provided as before. The asynchronous input signal 102 is applied to a first flip flop circuit 104. Flip flop 104 receives the synchronization clock signal 100 at its clock input, and provides its output at node 106 as the first input to a multiplexer circuit 108. The asynchronous input signal 102 also is connected directly to the second input to MUX 108 at node 110. A random logic source 112 provides for random selection between the first input 106 and the second input 110 to the multiplexer, so that the multiplexer output at node 114 reflects the asynchronous input signal 102 selectably delayed by either 0 or 1 clock cycle. This delayed signal at 114 is input to a second flip flop circuit 120 and the output of 120 at node 122 is connected to the input of another flip flop circuit 124. Flip flops 120 and 124 also receive the synchronization clock signal 100. Accordingly, the synchronous output signal at 130 reflects the multiplexer output 114 further delayed by two clock cycles. Accordingly, the circuit of FIG. 5 provides randomly selected delay of two or three clock cycles. Furthermore, some synchronization schemes might require only a single synchronization flip flop. The same timing uncertainty can be emulated by randomly selecting either a one or a two clock delay, applying the techniques described previously. For example, node 122 in FIG. 5 would provide that function.

In a gate-level implementation, each individual flip flop could be designed such that when its input setup or hold times were violated, the output would randomly assume the value of 0 or 1. FIG. 6 is a schematic diagram of a synchronization circuit in which each of the flip flops 140 and 142 have been so modified. Thus, all of the randomization is contained within the individual flip flops. This is another way to flush out timing violations during a design and debugging of a digital integrated circuit.

Here is an example of the "X" transition logic that can be used in a Verilog implementation of the invention:

```
module xdata (clk, sig_in, sig_out);
    parameter   MSB = 0;
    input   clk;
    input [MSB:0] sig_in;
    output [MSB:0] sig_out;
    reg [MSB:0]  sig_out;
    reg [MSB:0]  prev_sig_in;
    always @(sig_in or posedge clk) begin
        if (sig_in != prev_sig_in)
            sig_out <= 100'bx;
        else
            sig_out <= sig_in;
        prev_sig_in <= sig_in;
    end
endmodule
```

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

We claim:

1. A method for use in testing an asynchronous digital design in which a non-synchronized signal crosses from a first clock domain to a second clock domain, the method comprising the steps of:

responsive to a logic state transition on the non-synchronized signal from a first logic state to a second logic state, forcing the non-synchronized signal value to an "X" value, thereby starting an X value window;

monitoring the synchronization clock signal during the X value window; and then changing the non-synchronized signal value to the second logic state, thereby terminating the X value window, at a time responsive to the synchronization clock signal.

2. A method according to claim 1 wherein said changing step includes changing the non-synchronized signal value to the second logic state, thereby terminating the X value window, in response to a next edge of the synchronization clock signal.

3. A method according to claim 1 wherein said changing step includes changing the non-synchronized signal value to the second logic state, thereby terminating the X value window, after at least one cycle of the synchronization clock signal.

4. A method according to claim 1 including selecting the X value window duration so as to ensure compliance with predetermined timing constraints of receiving logic in the second clock domain.

5. A behavioral model for forming an output signal for use in simulating an asynchronous digital design in which a non-synchronized signal crosses from a first clock domain to a second clock domain, the model comprising:

means for intercepting and monitoring the non-synchronized signal;

means for assigning an initial value of the non-synchronized signal as an initial value of the output signal;

means for assigning an "X" simulation value to the output signal in response to a transition on the non-synchronized signal from the initial state to a complement state; and means for assigning the complement state of the non-synchronized signal to the output signal after a delay time responsive to the second clock domain clock signal.

6. A behavioral model according to claim 5 wherein the delay time is selected as at least one cycle of the second clock domain clock signal.

7. A method of introducing a simulated synchronization timing error into a simulated circuit running in a first clock domain to determine whether the simulated circuit is fault tolerant to the simulated synchronization timing error, where the simulated synchronization timing error is of a type that is created when a signal from a second clock domain is synchronized to the first clock domain and the signal is input to the simulated circuit, the method comprising the additional step of introducing a timing error at random times during the synchronization of the signal from the second clock domain to the first clock domain.

8. The method of claim 7, wherein the timing error further comprises one additional first clock cycle.

9. The method of claim 7, wherein the timing error further comprises setting the signal to an X value for a first X window that initiates at a leading edge of the signal after synchronization and also for a second X window that initiates at a trailing edge of the signal after synchronization.

10. The method of claim 9, wherein both the first X window and the second X window have an equal duration that is no less than a single first clock cycle.

11. The method of claim 9, wherein the first X window terminates with a next occurrence of a first clock cycle edge following initiation of the first X window, add the second X window terminates with a next occurrence of a first clock cycle edge following initiation of the second X window.

12. A method of introducing a simulated synchronization timing error into a simulated circuit running in a first clock domain to determine whether the simulated circuit is fault tolerant to the simulated synchronization timing error, where the simulated synchronization timing error is of a type that is created when a signal from a second clock domain is synchronized to the first clock domain and the signal is input to the simulated circuit, the method comprising the additional step of introducing one additional first clock cycle at random times during the synchronization of the signal from the second clock domain to the first clock domain.

13. A method of introducing a simulated synchronization timing error into a simulated circuit running in a first clock domain to determine whether the simulated circuit is fault tolerant to the simulated synchronization timing error, where the simulated synchronization timing error is of a type that is created when a signal from a second clock domain is synchronized to the first clock domain and the signal is input to the simulated circuit, the method comprising the additional step of setting the signal to an X value for a first X window that initiates at a leading edge of the signal after synchronization and also for a second X window that initiates at a trailing edge of the signal after synchronization during the synchronization of the signal from the second clock domain to the first clock domain.

14. The method of claim 13, wherein both the first X window and the second X window have an equal duration that is no less than a single first clock cycle.

15. The method of claim 13, wherein the first X window terminates with a next occurrence of a first clock cycle edge following initiation of the first X window, and the second X window terminates with a next occurrence of a first clock cycle edge following initiation of the second X window.

\* \* \* \* \*